United States Patent [19]

Tahara

[11] Patent Number: 4,905,086
[45] Date of Patent: Feb. 27, 1990

[54] TELEVISION TRANSMITTER EMPLOYING KLYSTRON WITH NONLINEARITY CORRECTION CIRCUIT

[75] Inventor: Noboru Tahara, Tokyo, Japan
[73] Assignee: NEC Corporation, Japan
[21] Appl. No.: 278,185
[22] Filed: Nov. 30, 1988

[30] Foreign Application Priority Data

Nov. 30, 1987 [JP] Japan .............................. 62-182658[U]

[51] Int. Cl. .............................................. H04N 5/38
[52] U.S. Cl. ...................................... 358/186; 330/44; 455/126
[58] Field of Search ...................... 330/43, 44, 45, 149; 358/186, 139; 455/115, 126

[56] References Cited

U.S. PATENT DOCUMENTS

| 4,485,349 | 11/1984 | Siegel et al. | 455/126 X |
| 4,670,789 | 6/1987 | Plume | 358/186 |
| 4,701,717 | 10/1987 | Radermacher et al. | 330/149 |
| 4,710,815 | 12/1987 | Douglas et al. | 358/186 |
| 4,733,192 | 3/1988 | Heppinstall et al. | 330/45 |

OTHER PUBLICATIONS

J. B. Bullock, "A System for Reducing the Power Required by UHF-TV Transmitters", NAB Engrg. Conference, Mar. 21-24, 1973.

Primary Examiner—James J. Groody
Assistant Examiner—Mark R. Powell
Attorney, Agent, or Firm—Ostrolenk, Faber, Gerb & Soffen

[57] ABSTRACT

A television transmitter includes a klystron power amplifier, a non-linearity pre-correction circuit in a stage preceding the klystron power amplifier, a non-linearity detection circuit for detecting the non-linearity of the output of the klystron power amplifier, a first level controlling circuit for controlling the level of the output of the non-linearity pre-correction circuit in response to the output of the non-linearity detection circuit, a hum frequency component detection circuit for detecting a hum frequency component of the output of the klystron power amplifier and a second level controlling circuit for controlling the level of either the input or the output of the non-linearity pre-correction circuit in response to the detected hum frequency component. The first and second level controlling level circuits are preferably variable attenuators. Preferably, the hum component detection circuit is an AGC circuit, which preferably detects the pedestal level in the output of the power amplifier, and then applies the detected level to a bandpass filter which passes a component of substantially 50 to 60 Hz contained in the pedestal level. A comparator compares the output of the bandpass filter against a reference level and generates an error signal, which is employed to control the second variable attenuator, which is either at the input or the output of the pre-correction circuit.

21 Claims, 5 Drawing Sheets

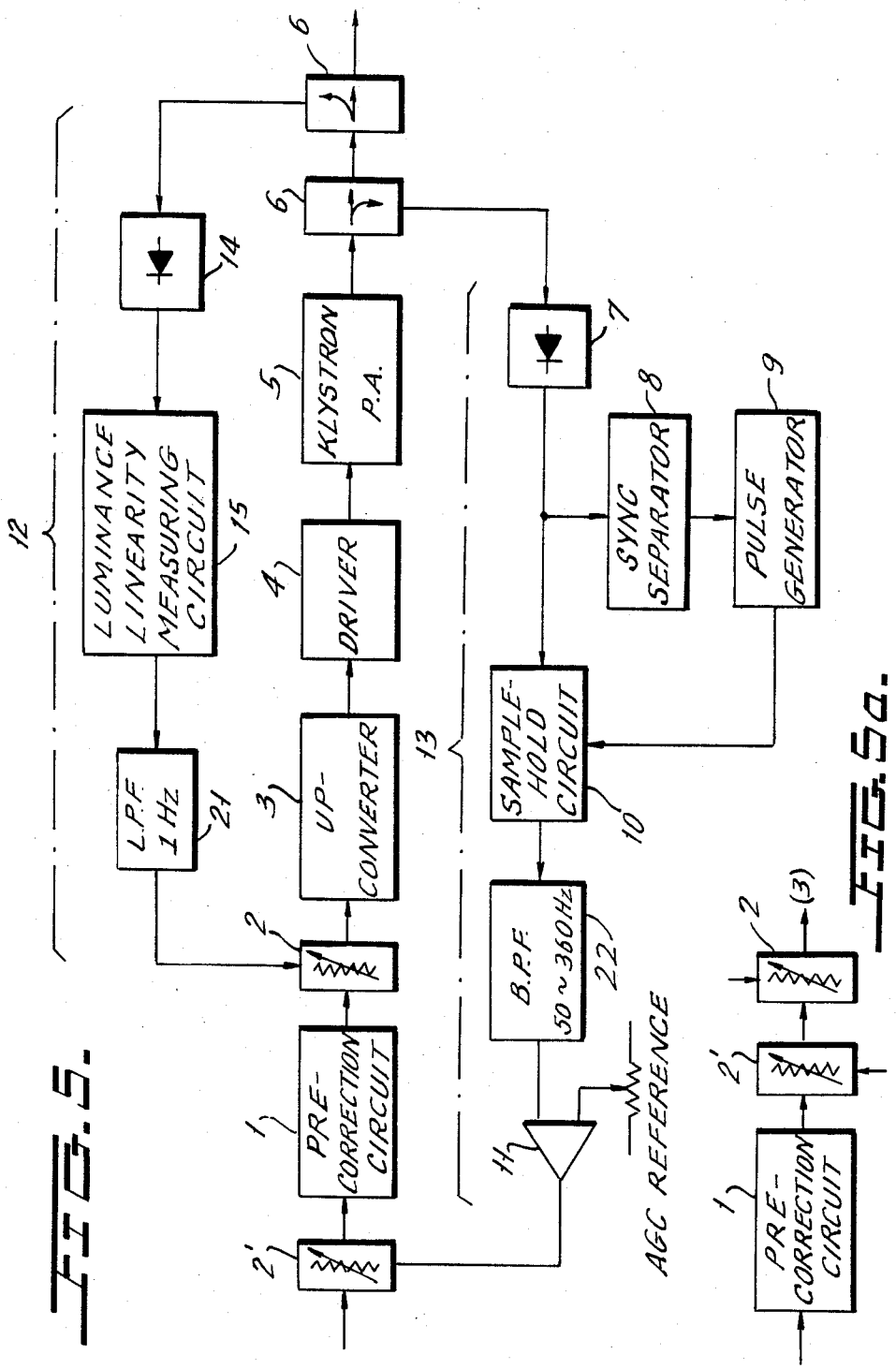

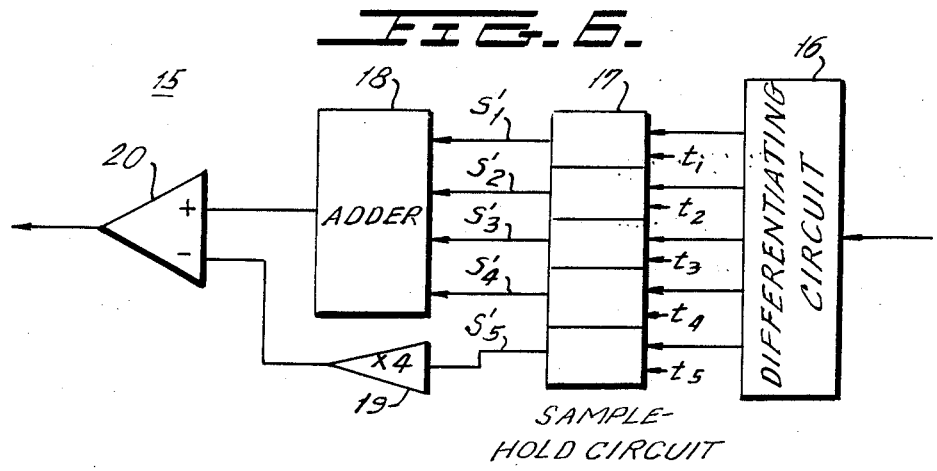
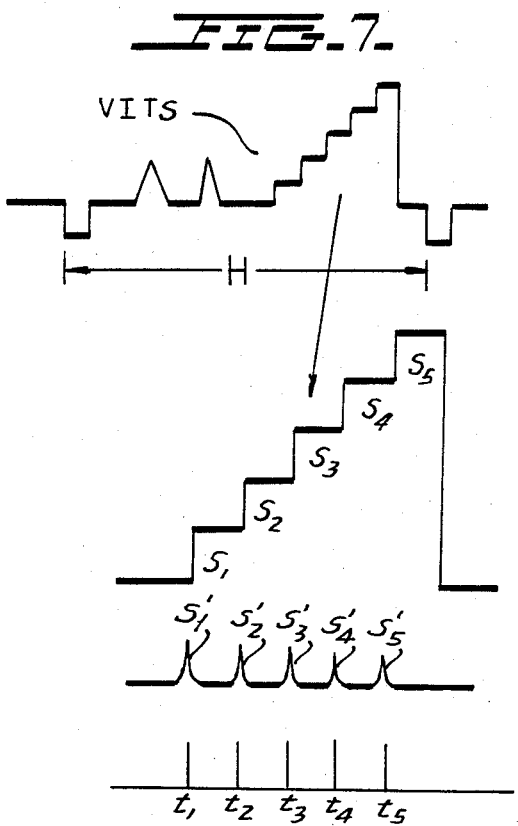

TELEVISION TRANSMITTER EMPLOYING KLYSTRON WITH NONLINEARITY CORRECTION CIRCUIT

BACKGROUND OF THE INVENTION

The present invention relates to a high power television transmitter, and more particularly, to a television transmitter employing a high power klystron.

In a prior art television transmitter employing a klystron, the klystron beam current is set to a lower level in order to save power consumption and, in other words, to improve the klystron power efficiency. The lower level setting of the klystron beam current leads to a non-linear input-output characteristic of the klystron, and, thus, non-linear distortion appears in the output television signal. Therefore, in order to compensate for the non-linear distortion, a pre-distortion (pre-correction) circuit is inserted in the preceding stage.

According to another prior art television transmitter, the klystron beam current is further decreased during an active video period in order to further improve the klystron power efficiency, but is increased during only a sync period to stretch a sync signal. Such beam current control is performed by controlling the anode voltage of the klystron and the television transmitter using this method has been known as the "Anode Pulser System". This system was introduced at the 30th NAB Engineering Conference, Mar. 21–24, 1978. This system makes the input-output characteristic of the klystron further deteriorate and requires a pre-correction circuit having larger correction capabilities.

In the above-described prior arts transmitters, when higher power efficiency is required, the linearity of the input-output characteristic becomes worse, so that the amount of correction needed in the pre-correction circuit is increased in accordance with the degree of improvement of the power efficiency. As a result, sufficient correction becomes impossible because the input-output characteristic varies because of a change in a level of a supply voltage and because of a change in a klystron condition or attribute in accordance with a time lapse. This adversely affects the standard of the output television signal to be transmitted. Particularly, the luminance linearity is adversely affected by the change in the input-output characteristic (gain) of the klystron.

SUMMARY OF THE INVENTION

Accordingly, an object of the present invention is to provide a television transmitter employing a klystron, which is capable of performing satisfactory compensation of linear deterioration that is caused by a change of the klystron input-output characteristic even when the beam current of the klystron is further decreased.

Another object of the present invention is to provide a television transmitter which is capable of further improving its power efficiency while maintaining the quality of its output television signal.

According to the present invention, there is provided a television transmitter, comprising a klystron power amplifier, a non-linearity pre-correction circuit disposed a stage preceding the klystron power amplifier, a linearity detection circuit for detecting the linearity of the output of the klystron power amplifier, first level controlling means for controlling the level of the output of the non-linearity pre-correction circuit in response to the output of the linearity detection circuit, a hum frequency component detection circuit for detecting a hum frequency component of the output of the klystron power amplifier, and second level controlling means for controlling the level of the input or the output of the non-linearity pre-correction circuit in response to the detected hum frequency component.

BRIEF DESCRIPTION OF THE DRAWINGS

FIG. 5 is a block diagram of an embodiment according to the present invention;

FIG. 5(a) is a partial block diagram of a second embodiment according to the present invention;

FIG. 6 is a block diagram representing a linearity correction circuit contained in FIG. 5; and FIG. 7 is a waveform diagram illustrating the operation of the linearity correction circuit shown in FIG. 6.

DETAILED DESCRIPTION OF PREFERRED EMBODIMENTS

Figure 1:
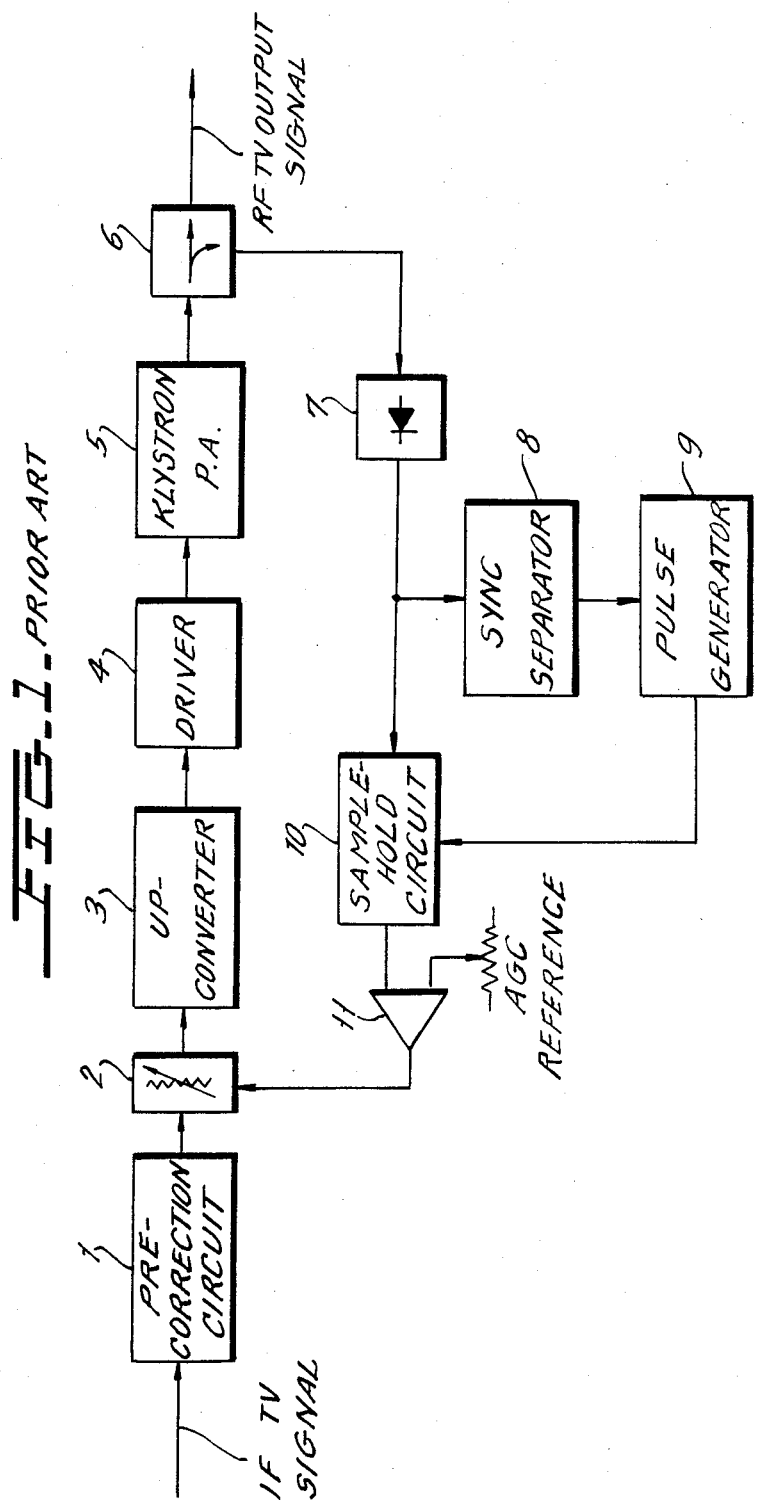
FIG. 1 is a block diagram of a prior art television transmitter employing a klystron.

Before going into the present invention, the prior art will be explained first for facilitating understanding of the present invention. FIG. 1 represents the first prior art television transmitter described above which uses a pedestal clamp system. In this Figure, a television signal converted into an intermediate frequency signal is supplied to a pre-correction circuit 1 in which nonlinearity of a klystron is corrected at this first stage. The output of the pre-correction circuit 1 is then supplied through a variable attenuator 2, to an up-converter 3 which frequency-converts it to a predetermined transmission frequency. The output of the up-converter 3 is supplied to a radio frequency (RF) driver 4 to drive a klystron power amplifier 5, thereby obtaining a high power RF television transmission output.

For the pedestal clamp, the output of the klystron power amplifier 5 is partly extracted by a directional coupler 6 and is partly supplied to a detector 7. The detected output is supplied to a sync separator 8, where a sync signal is separated. In response to the separated sync signal, a pulse generator 9 generates a sample-hold pulse having a timing related to the back porch of the sync signal and supplies it to a sample-hold circuit 10. The sample-hold circuit 10 sample and holds the detected output in response to the sample-hold pulse, thereby, holding the pedestal level of the television signal. The sample-hold level is then supplied to a comparator 11. The comparator 11 compares the sample-hold level with AGC reference level and supplies the comparison result to the variable attenuator 2 so as to carry out the AGC operation for maintaining the pedestal level in relation to the reference level at the output of the klystron amplifier.

Figure 2:
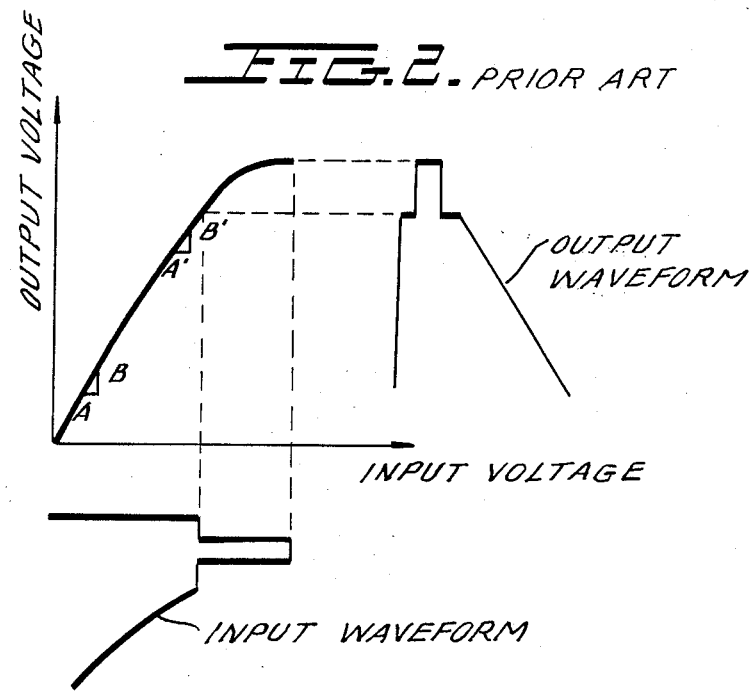
FIG. 2 is a drawing representing an input-output characteristic of the klystron in FIG. 1.

The input-output characteristic of the klystron in the construction of FIG. 1 is shown in FIG. 2. In this Figure, assuming that a gain variance B/A in a region where the output level is relatively low is 1, a gain variance B'/A' in a region where the output level is relatively high is about 0.7. Accordingly, the power efficiency obtained by the construction of FIG. 1 is limited to about 40 to 45(%).

Figure 4:
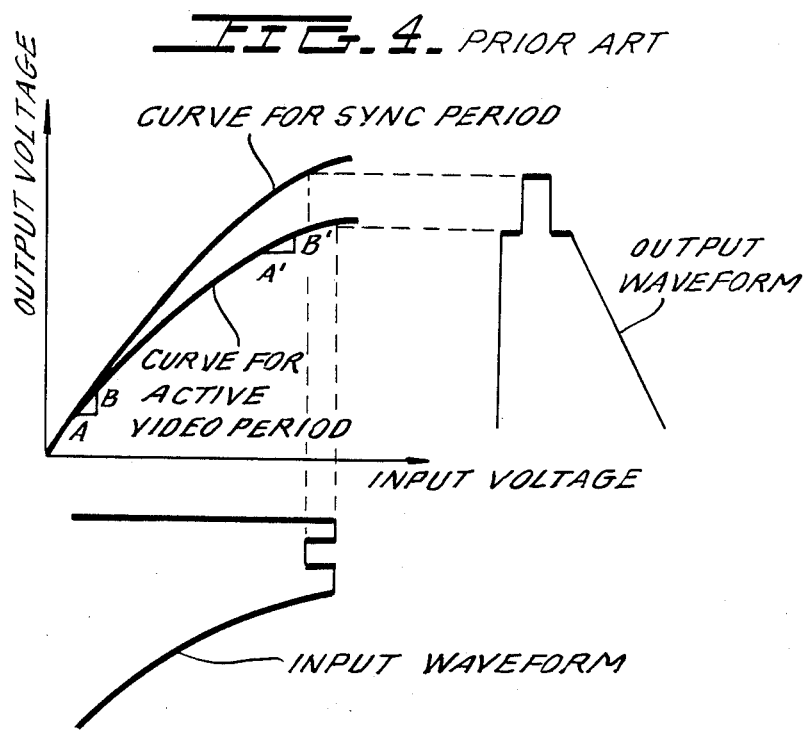
FIG. 4 is a drawing representing an input-output characteristic of the klystron in FIG. 3.
Figure 3:
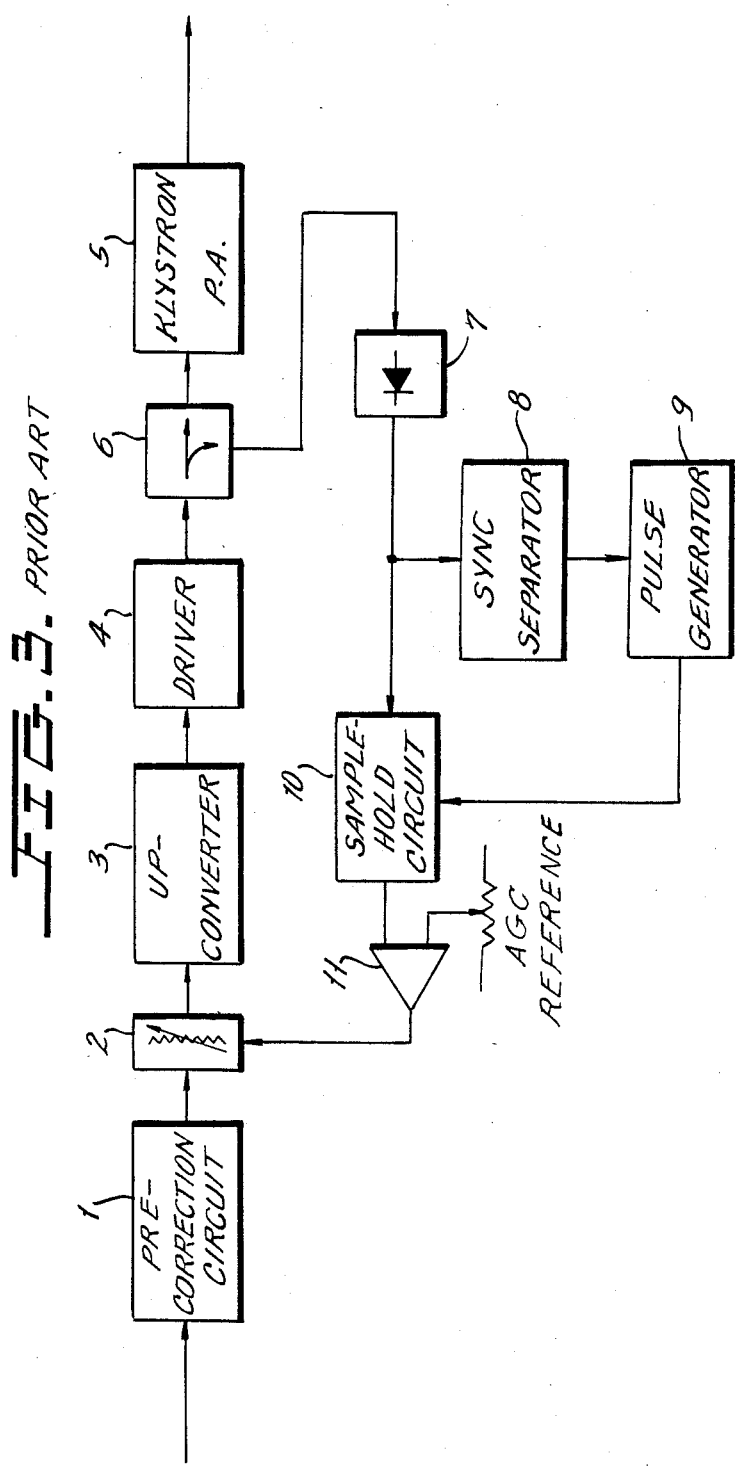
FIG. 3 is a block diagram of another prior art television transmitter employing a klystron.

FIG. 3 shows the second prior art television transmitter where the beam current of the klystron is decreased during the active video period. In FIG. 3, the AGC operation is different from that in FIG. 1. In this Figure, the output signal for controlling the AGC operation is extracted from an output of the driver 4 rather than from that of the klystron amplifier 5. According to the construction of FIG. 3, although there may be a level fluctuation at the output of the klystron amplifier 5, the deterioration the output television signal can be set within tolerance. The input-output characteristic of the klystron in FIG. 3 is shown in FIG. 4. In this case, the gain variance B′/A′ in the region where the output level is relatively high is about 0.3 to 0.4, on the assumption that the gain variance B/A in the region where the output level is relatively low is 1. Therefore, the klystron power efficiency obtained by the construction of FIG. 3 is about 55 to 60 (%).

As described above, non-linearity of the input-output characteristic is not avoided when the klystron operates in the condition of improving power efficiency and, thus, such non-linearity is compensated by providing the pre-correction circuit 1 in the preceding stage. However, the characteristic of the klystron varies due to a time lapse and a fluctuation of the supply voltage. Since the correction amount in the pre-correction circuit 1 is set constant, a correction curve in the pre-correction circuit 1 does not coincide with the fluctuated input-output characteristic of the klystron, accordingly. Further, when the correction amount in the pre-correction circuit is increased while obtaining a higher power efficiency, the aforementioned mis-match of the correction curve becomes worse. Accordingly, the output television signal from the klystron amplifier becomes deteriorated beyond the prescribed quality tolerances. In other words, with these prior art systems, further improvement of the klystron power efficiency can not be obtained.

An embodiment of the present invention will now be described with reference to the accompanying drawings. FIG. 5 is a block diagram representing an embodiment according to the present invention.

In FIG. 5, in addition to the basic construction of the prior art, the embodiment of the present invention comprises an automatic linearity correction circuit 12, which detects a luminance linearity (linearity of a low frequency band) and varies the level of the output of the pre-correction circuit 1 so as to stabilize the luminance linearity, and an AGC circuit 13 which varies the input level of the pre-correction circuit 1 in accordance with a level fluctuation having a frequency component of 50 Hz to 360 Hz at the output of the klystron amplifier 5.

The automatic linearity correction circuit 12 will be first described in detail. The output signal is extracted from the output of the klystron amplifier 5 by a directional coupler 6′ and demodulated by a detector 14. The demodulated signal is then supplied to a luminance linearity measuring circuit 15. The luminance linearity measuring circuit 15 delivers an output representative of the luminance linearity. A low pass filter 21 receives the output of the measuring circuit 15 and extracts a low frequency component of below about 1 Hz and supplies it to a variable attenuator 2. As a result, the variable attenuator 2 controls the output level of the pre-correction circuit 1 in order to correct the luminance linearity of the klystron.

One example of the luminance linearity measuring circuit 15 is shown in FIG. 6. As shown in FIG. 6, the measuring circuit 15 includes a differentiating circuit 16, a sample-hold circuit 17, an adder 18, a multiplier 19 and a comparator 20. This embodiment may be responsive to a vertical interval test signal (VITS) inserted in the television vertical blanking period which is used for measuring the luminance linearity, for example. Particularly, a five-step stairstep signal in the VITS shown in FIG. 7 is used. The differentiating circuit 16 produces five outputs including differentiated outputs $S_1'$ to $S_5'$ corresponding to the stairsteps $S_1$ to $S_5$ shown in FIG. 7. The sample-hold circuit 17 sample-holds the differentiated outputs at respective times $t_1$ to $t_5$. Therefore, the sample-hold circuit 17 delivers five levels respectively indicating amplitudes of the differentiated outputs $S_1'$ to $S_5'$. The adder 18 produces the sum of the differential outputs $S_1'$ to $S_4'$ and the multiplier 19 produces four times the amplitude of the differentiated output $S_5'$. The sum of the outputs $S_1'$ to $S_4'$ and the four times output $S_5'$ are compared by the comparator 20. The comparator 20 produces a difference signal indicating a measure of the luminance linearity.

Since the response speed of the automatic linearity correction circuit 12 is relatively low, it can not follow a characteristic change which occurs with a frequency of 50 Hz to 360 Hz (hum component). This characteristic change corresponds to a fluctuation of the supply voltage. Consequently, such a characteristic change occurring with a frequency of 50 Hz to 360 Hz in the klystron amplifier 5 is compensated by the AGC circuit 13. The AGC circuit 13 will be next described in detail. This circuit comprises a directional coupler 6, a detector 7, a sync separator 8, a pulse generator 9, a sample-hold circuit 10, a band pass filter 22, and a comparator 11. The combination of the blocks 8, 9 and 10 detects a pedestal level from the output of the detector 7. The band pass filter 22 passes the component of 50 to 360 Hz contained in the output of the pedestal level. The comparator 11 compares the output of the band pass filter 22 and reference level and generates an error signal indicating a difference therebetween. In response to the error signal, a variable attenuator 2′ controls the level of the input of the pre-correction circuit 1.

In the embodiment of FIG. 5, the AGC circuit 13 controls the input level of the pre-correction circuit 1. However, it is alternatively possible to achieve the objects of the invention by controlling the output level of the pre-correction circuit 1 by means of the AGC circuit 13. FIG. 5(a) partially shows this circuit arrangement.

As described above, according to the present invention, by means of the automatic linearity correction circuit for stabilizing the luminance linearity in the output of the klystron amplifier, and the AGC circuit for compensating for the input-output characteristic fluctuation at the hum frequency, there is obtained the television transmitter capable of avoiding deterioration of the output television signal due to fluctuation of a power supply voltage, characteristic change of the klystron in a rising-up condition, and change in the linearity of the klystron due to a time lapse.

Further, according to the present invention, the klystron can operates with the best power efficiency and the power efficiency can be improved to about 60 to 70 (%).

What is claimed is:

1. A television transmitter employing a klystron, comprising:
    a klystron power amplifier;
    a non-linearity correction circuit which receives an input high frequency television signal and corrects a distortion generated by said klystron power amplifier;
    a driving amplifier which receives an output from said non-linearity correction circuit and drives said klystron power amplifier;
    non-linearity detection means for receiving an output of said klystron power amplifier and for detecting a non-linearity thereof;
    first level varying means for controlling an output level of said non-linearity correction circuit according to an output of said non-linearity detection means, an output of said level varying means being supplied to said drive amplifier;
    hum component detection means for detecting a hum frequency component in the output of said klystron power amplifier; and
    second level varying means for controlling an input level to said non-linearity correction circuit according to an output of said hum component detection means.

2. A television transmitter as claimed in claim 1, wherein said non-linearity detection means includes a detector for extracting a base band television signal from the output of said klystron power amplifier, and measuring means for measuring a linearity on a basis of a stairstep wave in a test signal inserted in the television signal upon receipt of said base band television signal from said detector.

3. A television transmitter as claimed in claim 2, wherein said non-linearity detection means further includes a low-pass filter for passing a low frequency component from an output of said first measuring means, said low frequency component being supplied to said level varying means.

4. A television transmitter as claimed in claim 2, wherein said measuring means includes a differentiating circuit for differentiating the stairstep wave in the test signal, and a relative change judging means for judging a relative level change in a plurality of differential outputs corresponding to rising-up portions of the stairstep wave upon receipt of an output of said differentiating circuit.

5. A television transmitter as claimed in claim 1, wherein said hum component detection means detects a component of substantially 50-360 Hz in the output of said klystron power amplifier.

6. A television transmitter as claimed in claim 1, wherein said hum component detection means includes:
    output signal detecting means for detecting and outputting an output signal derived from said power amplifier output; and
    band pass filter means for passing a selected range of frequency components of said output signal and thereby detecting said hum component of said power amplifier output.

7. A television transmitter as claimed in claim 6, wherein said output signal detecting means detects a pedestal level in said power amplifier output.

8. A television transmitter as claimed in claim 6, further comprising detector means for receiving said power amplifier output and producing a detector output signal and providing same as an input to said output signal detecting means.

9. A television transmitter as claimed in claim 6, wherein said second level varying means comprises a comparator which receives said hum component and compares it against a reference to produce an error signal.

10. A television transmitter as claimed in claim 9, wherein said second level varying means further comprises a variable attenuator which receives said input television signal and said error signal, attenuates said input television signal in response to said error signal, and supplies the attenuated input television signal as an input to said non-linearity correction circuit.

11. A television transmitter as claimed in claim 6, wherein said second level varying means comprises a variable attenuator which receives said input television signal, attenuates the same as a function of said hum component, and supplies the attenuated input television signal as an input to said non-linearity correction circuit.

12. A television transmitter as claimed in claim 6, wherein said selected frequency range is substantially 50-360 Hz.

13. A television transmitter employing a klystron, comprising:
    a klystron power amplifier;
    a non-linearity correction circuit which receives an input high frequency television signal and corrects a distortion generated by said klystron power amplifier;
    a driving amplifier which receives an output from said non-linearity correction circuit and drives said klystron power amplifier;
    non-linearity detection means for receiving an output of said klystron power amplifier and for detecting a non-linearity thereof;
    first level varying means for controlling an output level of said non-linearity correction circuit according to an output of said non-linearity detection means, an output of said level varying means being supplied to said drive amplifier;
    hum component detection means for detecting a hum frequency component in the output of said klystron power amplifier; and
    second level varying means for controlling the output of said non-linearity correction circuit in accordance with an output of said hum component detection means.

14. A television transmitter as claimed in claim 13, wherein said hum component detection means detects a component of substantially 50-360 Hz in the output of said klystron power amplifier.

15. A television transmitter as claimed in claim 13, wherein said hum component detection means includes:
    output signal detecting means for detecting and outputting an output signal derived from said power amplifier output; and
    band pass filter means for passing a selected range of frequency components of said output signal and thereby detecting said hum component of said power amplifier output.

16. A television transmitter as claimed in claim 15, wherein said output signal detecting means detects a pedestal level in said power amplifier output.

17. A television transmitter as claimed in claim 15, further comprising detector means for receiving said power amplifier output and producing a detector output signal and providing same as an input to said output signal detecting means.

18. A television transmitter as claimed in claim 15, wherein said second level varying means comprises a comparator which receives said hum component and compares it against a reference to produce an error signal.

19. A television transmitter as claimed in claim 18, wherein said second level varying means further comprises a variable attenuator which receives the output of said non-linearity correction circuit and said error signal, and attenuates said non-linearity correction circuit output in response to said error signal.

20. A television transmitter as claimed in claim 15, wherein said second level varying means comprises a variable attenuator which receives the output of said non-linearity correction circuit, and attenuates the same as a function of said hum component.

21. A television transmitter as claimed in claim 15, wherein said selected frequency range is substantially 50–360 Hz.

* * * * *